United States Patent [19]

Diller et al.

[11] Patent Number: 4,779,994

[45] Date of Patent: Oct. 25, 1988

[54] HEAT FLUX GAGE

[75] Inventors: Thomas E. Diller; Shinzo Onishi, both of Blacksburg, Va.

[73] Assignee: Virginia Polytechnic Institute and State University, Blacksburg, Va.

[21] Appl. No.: 109,057

[22] Filed: Oct. 15, 1987

[51] Int. Cl.⁴ .................................. G01K 17/00
[52] U.S. Cl. ................................ 374/29; 136/225; 374/30
[58] Field of Search ............ 374/29, 30, 31; 136/225

[56] References Cited

U.S. PATENT DOCUMENTS

| | | | |
|---|---|---|---|
| 1,528,383 | 3/1925 | Schmidt | 374/30 X |
| 3,354,720 | 11/1967 | Hayer, Jr. | 374/132 |
| 3,554,815 | 1/1971 | Osborn | 136/225 X |
| 3,607,445 | 9/1971 | Hines | 374/29 X |
| 4,197,738 | 4/1980 | Degenne | 374/30 |
| 4,577,976 | 3/1986 | Hayashi et al. | 374/30 X |
| 4,583,867 | 4/1986 | Gautheret | 374/144 X |

*Primary Examiner*—Daniel M. Yasich
*Attorney, Agent, or Firm*—Lawrence W. Langley

[57] ABSTRACT

The invention is a heat flux gage applied to a surface, for the measurement of surface heat transfer. All elements of the gage are thin films, deposited on the surface by sputtering or an equivalent process. The gage comprises a plurality of thermocouple junctions connected as a differential thermopile, with hot and cold junctions on the two faces of a planar thermal resistance element. Electrical insulating and protective layers are deposited between the surface and the gage, and over the exterior of the gage. The gage output signal is a voltage indicative of heat flux.

6 Claims, 1 Drawing Sheet

SECTION A-A

4,779,994

HEAT FLUX GAGE

BACKGROUND OF THE INVENTION

This invention relates to a method and apparatus for the measurement of surface heat transfer, i.e. the rate of heat flow per unit area into or out of a surface. This type of measurement is of value in energy production and utilization systems of many kinds. The existing methods for performing such measurements employ three techniques: (1) measurement of an applied power; (2) measurement of a change in temperature; or (3) measurement of a temperature difference.

The first technique for measuring surface heat transfer is limited in accuracy, particularly for measurements over a small surface area. This limitation is described in my research paper, "Analysis and Design of Experimental Systems for Heat Transfer Measurement from Constant Temperature Surfaces," co-authored by T. VandenBerghe and submitted for publication to the *International Journal of Heat and Mass Transfer*. Other approaches to the measurement of surface heat transfer which employ measurements of applied power are described in: "An Instrument for the Measurement of Heat Flux from a Surface with Uniform Temperature," by Kraabel, J. S., Baughn, J. W. and McKillop, A. A., published in *ASME Journal of Heat Transfer*, Vol. 102, 1980, pp. 576–578; "Total and Local Heat Transfer from a Smooth Circular Cylinder in Cross-Flow at High Reynolds Number," by Achenbach, E., published in *International Journal of Heat and Mass Transfer*, Vol. 18, 1975, pp. 1387–1396; and "Design and Calibration of a Local Heat-Flux Measurement System for Unsteady Flows," by Campbell, D. S., Gunduppa, M., and Diller, T. E., published in *Fundamentals of Forced and Mixed Convection*, ASME 1985, pp. 73–80. These references illustrate the difficulty of performing surface heat transfer measurements by measurement of applied power.

The second technique for surface heat transfer measurement is described by Gladden, H. J. and Proctor, M. P. in "Transient Technique for Measuring Heat Transfer Coefficients on Stator Airfoils in a Jet Engine Environment", *AIAA Paper No.* 85-1471, July 1985, and by Elrod, W. C., Gochenaur, J. E., Hitchcock, J. E., and Rivir, R. B., in "Investigation of Transient Techniques for Turbine Vane Heat Transfer Using a Shock Tube," *ASME Paper* 85-*IGT*-17, 1985. While this technique is easier to apply to a local region of a surface than the first method, the results are a function of both the surface material properties and the analytical model used to reduce the data. If the temperature measurements are made in the material of the surface itself, they may be limited in range or accuracy because the material is hard to form or machine into the required configuration. Calibrations in situ of transient heat flux gages are usually quite difficult.

A device which employs the third technique for surface heat transfer measurement is described in U.S. Pat. No. 3,607,445, issued to Frank F. Hines. This device is a heat flux gage comprising a planar thermal resistance element and a differential thermopile whose "cold" junctions are on one face of the planar thermal resistance element, and whose "hot" junctions are on the other. The heat transfer of a surface is measured with this device by placing the planar thermal resistance element in close thermal contact with the surface, and using the output voltage of the thermopile to measure the temperature difference across the planar thermal resistance element. This gage must be calibrated to determine its voltage output as a function of heat transfer; a value affected by the thickness and material of the planar thermal resistance element, the number of thermopile elements, and the materials and configuration of the thermoelectric junctions. While the Hines gage and others using similar principles are effective and accurate, they have a number of known disadvantages.

The output voltage of the Hines gage is proportional to the temperature drop across the planar thermal resistance element. For convenient and precise measurement of this voltage it would be desirable to make the planar thermal resistance element as thick as possible, and fabricate it from a material with high thermal resistivity. However, in many experiments the gage must be physically thin (e.g. in aerodynamics, to minimize surface flow disturbances), and the temperature drop across the gage must be a minimum to avoid disrupting the heat flux distribution over the surface. Increasing the number of thermopile elements to obtain a larger voltage for a desirably thin planar thermal resistance element will increase the surface area of the gage, and render it less useful for detailed measurements of thermal flux distribution.

The application of such gages to surfaces whose materials may be ceramic, metallic, or composite, and whose shape may be flat or curved, is a challenge to the experimenter. They may be attached by use of an adhesive, but the thermal and mechanical properties of the adhesive are then critical to the accuracy of heat flux measurement. The temperature drop across the adhesive layer is usually a significant part of the total drop across the gage, and the maximum service temperature of the gage itself is equal to that of the adhesive.

In his report on Calspan Field Services, Inc. AEDC Project D228VW, "A Durable, Intermediate Temperature, Direct Reading Heat Flux Transducer for Measurements in Continuous Wind Tunnels", *AEDC TR*-81-19, November, 1981, page 10, the author C. T. Kidd summarizes the dilemma facing users of heat flux gages by saying "An ideal transducer for aerodynamic heat transfer measurement applications in continuous wind tunnels would have an output signal directly proportional to the heat flux incident on the sensing surface, a heat flux sensitivity $\leq 20$ mv/Btu/ft$^2$-sec, and a time response on the order of 0.10 sec. In addition, the ideal transducer would have a sensing surface temperature exactly the same as the adjacent model or test article surface, a maximum continuous service temperature of at least 1,500° F., and a calibration scale factor completely independent of ambient gage temperature. Physical characteristics of the transducer should include small size ($>0.125$ in. diam. by $\leq 0.35$ in.), ability to be contoured exactly to match a model surface, and ability to withstand any normal test environment with no structural damage. It may be possible to achieve one or more of these ideal performance factors with practical application of the Schmidt-Boelter concept; however, even an inexperienced gage designer would recognize that it would be virtually impossible to attain all of these performance factors in one gage. Therefore, design tradeoffs have to be made."

In his definition of the "ideal transducer", the author was mainly concerned with applications in which the heat flux is so low that it is difficult to measure the thermoelectric output potential of a gage. A more challenging case is one where the heat flux is high, and the gage output is no longer a linear function of heat flux because the temperature drop across the gage is large. For this case the "ideal transducer" is a gage with a lower heat flux sensitivity, but having an output potential more nearly linear with heat flux at higher values.

We have developed a heat flux gage which employs a novel construction and method of application to a surface, thereby solving the problems of previous devices and yielding characteristics which surpass the ideal of Kidd, as it would apply to high heat flux applications. The details of construction and application of this gage are hereinafter described, along with its features and advantages in the measurement of heat flux under a variety of circumstances.

SUMMARY OF THE INVENTION

In the preferred embodiment the gage of the invention is a combination of thin film layers, applied directly to the surface whose heat transfer is to be measured. For the purposes of this disclosure, a thin film is defined as a layer of material of uniform composition, with uniform thickness in the order of 0.01 to 10.0$\mu$. The gage comprises a differential thermopile whose "cold" junctions are arrayed on one face of a planar thermal resistance element, and whose "hot" junctions are arrayed on the other face of the planar thermal resistance element. Each "cold" junction produces a first thermoelectric potential predictable by the well-known Seeback coefficient, and each "hot" junction produces a second, slightly greater thermoelectric potential opposed in sense to the first, and also predictable by the Seeback coefficient. The interconnection of a large number of such junctions in an electrical series arrangement produces a potential which is the sum of many small differences in Seebeck potential, and may be a large voltage compared to that of a single junction. Using thin film techniques, a large number of junctions may be produced and interconnected in series within a small area. A large number of junctions allows the use of a very thin planar thermal resistance element, because only a small temperature difference is required to produce a precisely measurable signal from the resulting heat flux gage. "A gage which is configured to measure the heat flow into a surface will have 'cold junctions' comprising first and second electrodes next to the surface, a planar thermal resistance layer covering the 'cold junctions', and 'hot junctions' comprising third and fourth electrodes on the outside of the resistance layer. Such a gage is also capable of measuring heat flow out of the surface with no changes in its connections. The 'cold junctions' simply become 'hot junctions', and vice versa when heat flows in the opposite direction. The gage constant will be the same, but the polarity of the gage voltage will be reversed."

We have found that with this method of construction it is possible to produce a heat flux gage whose physical configuration and performance characteristics are greatly improved over those of existing devices. Thermal and electrical insulating layers, thermopile elements and interconnections between electrical parts of the gage are all deposited as thin films by conventional photolithography and sputtering processes. These methods yield a gage which is extremely thin, small in area, and capable of exceptionally rapid response. With the proper choice of materials the heat flux gage of the invention may be designed to withstand high temperatures and very high heat flux rates, while retaining the accuracy and linearity of gages which are physically much larger.

BRIEF DESCRIPTION OF THE DRAWINGS

FIG. 3 is a process diagram illustrating the steps used in making a gage of the preferred embodiment of the invention.

DETAILED DESCRIPTION OF THE INVENTION

Figure 1:
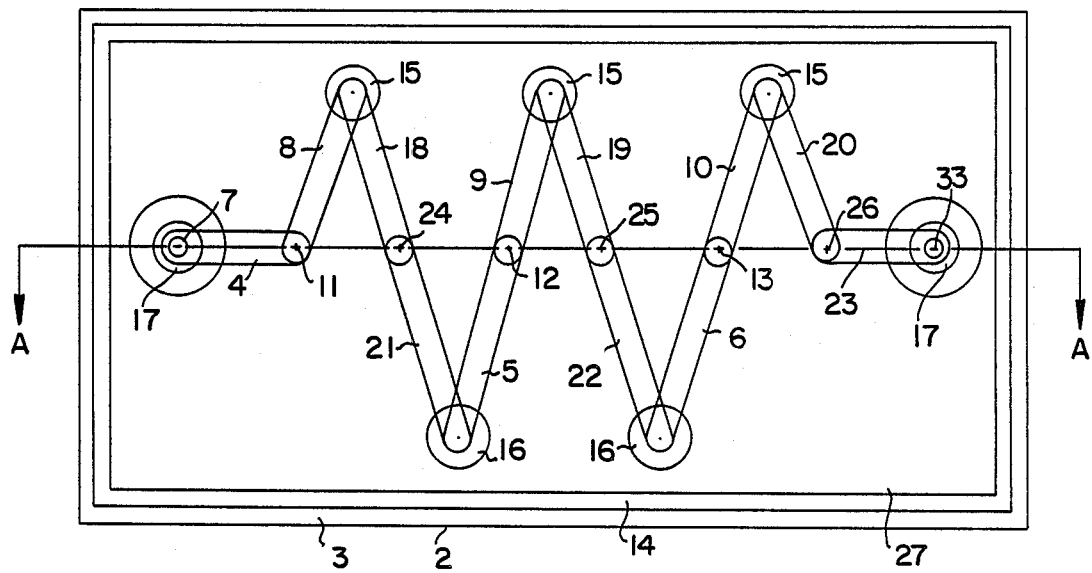
FIG. 1 is a plan view of a gage constructed according to the preferred embodiment of the invention, but depicting only a small number of thermoelectric junctions.

For clarity and simplicity only three pairs of thermoelectric junctions are depicted in FIG. 1, while it is understood that in the preferred embodiment the heat flux gage of the invention will comprise a much larger number, for example 50 to 500 thermoelectric junctions. The gage 1 consists of a plurality of thin film layers, deposited in sequential fashion by sputtering onto surface 2 of a test article 34. Each thin film layer has a particular geometric pattern and relationship with other layers which produces the desired interconnections and thermal relationships between different elements of the gage. The surface 2 whose heat transfer is to be measured may be electrically conductive or nonconductive. For example, the material of a typical turbine blade whose surface heat transfer is to be measured might be Rene' 80, a nickel-based alloy with exceptionally high service temperature and strength. This alloy is electrically conductive, making it desirable to insulate the gage electrically from the surface, while maintaining good thermal contact between the gage and the surface. This combination of functions is provided by a base insulating layer 3 of aluminum nitride, a ceramic with low electrical conductivity and high thermal conductivity. The thickness of the base insulating layer 3 may be about 0.06$\mu$ (600 Å), to provide good electrical insulation without excessive temperature drop.

The first electrodes 4, 5 and 6 of the heat flux gage thermopile are deposited directly on the base insulating layer 3. These electrodes are made of a first refractory metal whose properties as an element of a thermocouple are well known. For example, the first electrodes may be made of nickel metal, and their thickness may be about 0.1$\mu$(1000 Å). Electrode 4 overlaps the end 7 of a thru-conductor 28 which is used to connect this end of the thermopile to a voltage measuring instrument. The second electrodes 8, 9 and 10 of the heat flux gage thermopile partially overlap the first electrodes 4, 5 and 6 respectively to produce a first set of thermoelectric junctions 11, 12 and 13. The second electrodes are made of a second refractory metal, whose properties as a couple with the first refractory metal are well understood. For example the second electrodes 8, 9 and 10 may be of platinum metal, and their thickness may also be about 0.1$\mu$ (1000 Å).

The planar thermal resistance element 14 is a layer of silicon dioxide about 1.0$\mu$ (10,000 Å) thick, which has low thermal and electrical conductivity. It covers the first and second electrodes and their junctions completely, except for interconnection areas 15 and 16 at the ends of these electrodes and the end connection area 17. These areas are left uncovered for interconnections across the thickness of the planar thermal resistance element 14.

The third electrodes 18, 19 and 20 are deposited directly on the planar thermal resistance element 14, overlapping the second electrodes in areas 15, and are of the same metal and thickness (i.e. platinum, 0.1µ thick). The fourth electrodes 21, 22 and 23 are deposited on the planar thermal resistance element 14 and partially overlap the third electrodes 18, 19 and 20, forming a second set of thermocouple junctions 24, 25 and 26, respectively. Electrodes 21 and 22 overlap electrodes 5 and 6 in areas 16, and are of the same metal and thickness (i.e. nickel, 0.1µ) Electrode 23 overlaps the end 33 of the second thru-conductor 29. The thermoelectric junctions 11, 12 and 13 which lie between the surface 2 and the planar thermal resistance element 14 are thus connected in series with the thermoelectric junctions 24, 25 and 26 which lie on the outer side of the planar thermal resistance element 14, and this entire series string of 6 thermocouples is connected to thru-conductors 28 and 29.

A protective layer 27 is deposited over the entire heat flux gage to prevent contamination or physical damage during its use. In the preferred embodiment this layer is 0.06µ (600 Å) of silicon nitride, whose high thermal and low electrical conductivity provide the same functions as the base insulating layer 3, as well as physically protecting the flux gage thermoelectric elements and interconnections. Ideally, this layer is sputtered in two stages, each depositing a layer 0.03µ thick, to reduce the incidence of pinholes.

Figure 2:
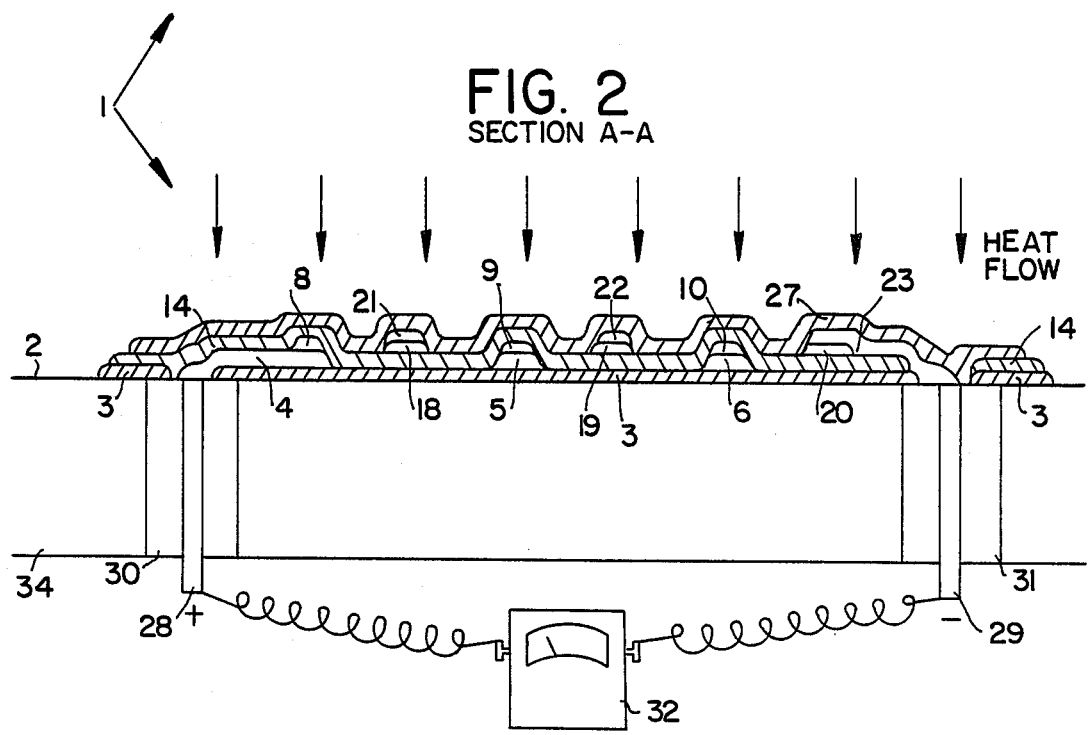
FIG. 2 is a cross-sectional view along line A—A of a gage constructed according to the preferred embodiment of the invention, but depicting only a small number of thermoelectric junctions.

FIG. 2 is a sectional view of the heat flux gage of the preferred embodiment along line A—A of FIG. 1, showing more clearly the overlapping relationships of electrodes which form the thermoelectric junctions and end connections. FIG. 2 also shows the manner in which connections are made between the gage of the invention and an external measuring instrument. Because a principal feature of the gage is its small thickness, the interconnections should not project above the surface further than elements of the gage itself. The figure shows two thru-conductors 28 and 29 surrounded by tubular insulators 30 and 31, which penetrate the surface through holes within the area of the gage. One end of each thru-conductor and tubular insulator is in the plane of the surface 1. The ends of the tubular insulators in the plane of the surface are partially covered by the base insulating layer 3 but the ends of the thru-conductors are not. As shown in the figure, the end electrodes 4 and 23 of the thermopile make electrical contact with the thru-conductors 28 and 29, which may be used to connect the gage to a voltmeter 32 or other measuring instrument. All parts of the gage shown in FIG. 2 are labeled with the numbers used in FIG. 1 and in the description above. "The sense of thermocouple 11, formed by first electrode 4, of nickel, and second electrode 8, of platinum, is such as to produce a negative voltage on thru-conductor 28 and a positive voltage on thru-conductor 29. The sense of thermocouple 24, formed by third electrode 18, of platinum, and fourth electrode 21, of nickel, is such as to produce a positive voltage on thru-conductor 28 and a negative voltage on thru-conductor 29. Lacking any temperature difference between the two thermocouples, these voltages will exactly oppose and cancel. With heat flowing in the direction indicated in the figure, thermocouple 24 will be hotter, being on the outside of the thermal resistance element 14, and will produce a voltage of greater magnitude. Under these circumstances thermocouples 25 and 26 will also produce greater voltages than thermocouples 12 and 13, so the combined result will be a positive voltage on thru-conductor 28 and a negative voltage on thru-conductor 29."

The output voltage of this gage can be calculated as:

$$E = n[(e^{ni/pt})_{t1} - (e^{ni/pt})_{t2}]$$

where:
- n = number of thermocouple junction pairs
- t1 = temperature on hotter face of planar thermal resistance element
- t2 = temperature on cooler face of planar thermal resistance element
- $e^{ni/pt}$ = potential of single nickel-platinum couple A typical number for n in the preferred embodiment would be 100, thus the output voltage is 100 times that of a single pair of junctions, with one on each face of the planar thermal resistance element. A typical temperature difference across the planar thermal resistance would be 0.5° F.

DESCRIPTION OF THE PROCESS FOR MAKING THE INVENTION

FIG. 3 is a diagram of process steps for producing a heat flux gage of the preferred embodiment. All of the materials and equipment required for the processes described herein are commercially available. Those skilled in the art will recognize that equivalent steps, materials and equipment may be substituted for the process steps of FIG. 3 to achieve the same physical structure and performance in the invention without departing from the spirit and scope of the process described herein.

While the process diagrammed in FIG. 3 is intended for placement of a heat flux gage directly upon the surface of a test article in order to instrument and measure its heat transfer, the same process can be used to produce a heat flux measuring region on the end of a transducer or probe. Such a transducer or probe may then be used to explore the heat transfer characteristics of a region of space, or may be placed in an aperture in a test object. The latter may be the preferred mode of use of the heat flux gage when the test object size or shape does not permit direct application of the gage elements. The surface described in the process of FIG. 3 may be, therefore, any surface upon which one wishes to place a heat flux gage.

The first step in preparing an object for application of the heat flux gage of the invention is to produce thru holes for connection of the ends of the thermopile with its voltage measuring instrumentation. These holes may be drilled or milled, but in the preferred embodiment they are electrical discharge machined because the EDM process can be used with any conductive material, regardless of its hardness. The EDM process cannot be used on non-conducting materials, however; holes through the surface of such materials must therefore be drilled or milled. The thru holes must be accurately spaced so that subsequent masking operations will result in proper connections between the ends of the heat flux gage and the thru-conductors.

The second step in preparing an object for application of the invention is to insert the thru-conductors 28 and 29 and tubular insulators 30 and 31 and fasten them in place. In the preferred embodiment the thru-conductors are nickel wires, and the tubular insulators are made of a material which has good high temperature electrical insulating properties. The thru-conductors and tubular insulators are preferably pressed into the thru holes without use of a bonding agent, in order to avoid limiting the maximum use temperature of the assembly to that of an adhesive. Both thru-conductors and tubular insulators are allowed to project slightly (about 0.1 mm.) above the surface.

The third step in preparing an object for application of the invention is to grind and polish the surface 1 on which the heat flux gage will be located. In this step the thru-conductors and tubular insulators will also be ground and polished flush with the surface.

The fourth step is to use a lift-off process to form the base insulating element 3, a layer of silicon nitride, over the entire area which will be covered by the heat flux gage. The sputtering target used in this step may be composed of silicon or silicon nitride.

In the lift-off process, a layer of photoresist such as AZ Shipley 1350B, approximately 7500 Å thick, is first applied to the object surface and baked at 90° C. for 20 minutes. Areas on which sputtered material is to be applied are then masked. The unmasked areas are exposed to ultraviolet light for approximately 7 seconds and developed using an alkaline developing solution for 30 to 40 seconds. The object is then placed in a sputtering apparatus such as a Series II Research S-Gun Turbosystem and coated by dc sputtering at a pressure of $5 \times 10^{-4}$ Torr of argon.

The object is then washed with acetone for 30 minutes to remove the photoresist in the unmasked areas. The layer of sputtered material deposited on these areas is lifted off, and the surface is rinsed with acetone and distilled water. In sputtering electrical insulation, it is customary to use a two step process, depositing half of the intended thickness at a time. This reduces the incidence of pinholes.

In the fourth and subsequent steps the masks used to produce the patterns of photoresist for the various layers and electrodes are aligned on the surface in reference to the ends of the thru-conductors 28 and 29. This insures that overlaps between the electrodes will produce the desired thermoelectric junctions and interconnections.

The fifth step is to use the lift-off process, with nickel metal, to produce the first electrodes 4, 5 and 6 in the configuration of FIG. 1 and a thickness of $0.1\mu$ (1000 Å) thick.

In the sixth step the lift-off process is used with platinum metal to produce the second electrodes 8, 9 and 10, also $0.1\mu$ (1000 Å) thick, and their thermoelectric junctions 11, 12 and 13.

The seventh step applies the planar thermal resistance element 14, a layer of silicon dioxide about $1.0\mu$ (10,000 Å) thick, over the entire gage area except for the connection areas 15, 16 and 17.

In the eighth and ninth steps, electrodes 18, 19 and 20 of platinum and electrodes 21, 22 and 23 of nickel are deposited by the lift-off process, forming thermoelectric junctions 24, 25 and 26, and completing the connection to thru-conductor 29. These electrodes are all $0.1\mu$ (1000 Å) thick.

In the final step a layer of silicon nitride, the protective layer 27, is deposited by sputtering over the entire heat flux gage, with a thickness of $0.06\mu$ (600 Å). The mask for this step need not be precisely registered with respect to the thru-conductors 28 and 29, and may be eliminated entirely if desired. The gage is now ready for use.

PERFORMANCE OF THE INVENTION

The performance of the preferred embodiment of the invention may be predicted from knowledge of the thermoelectric potential of the chosen metals, the thermal properties of the insulating layers and the planar thermal resistance layer and their thicknesses. For an example calculation the following dimensions and materials were selected:

Gage area dimensions: 2.0 mm. by 0.2 mm.
Base insulating layer: $0.06\mu$ silicon nitride
Planar thermal resistance element: $1.0\mu$ silicon dioxide
Protective layer: $0.06\mu$ silicon nitride
First and fourth electrodes: $0.1\mu$ nickel
Second and third electrodes: $0.1\mu$ platinum
Number of junctions: 100 on each side of planar thermal resistance element The calculated performance of this gage is as follows:
Gage constant: 0.017 mv. per BTU/ft$^2$-sec=0.015 mv. per w/cm$^2$
Gage thermal drop: 0.02° F. per BTU/ft$^2$-sec=0.01° C. per w/cm$^2$
Gage time constant: 5 microseconds
Maximum use temperature: 1000° C.
Gage area: 0.4 mm$^2$ The preferred embodiment is thus shown to provide performance superior to the "ideal transducer" described by Kidd, as we have interpreted it for high flux applications.

APPLICATIONS OF THE INVENTION

The heat flux gage of the invention may be employed to greatest advantage in those application areas where its unique features can be exploited. Those features of the gage which have the greatest influence on its applicability are:

- its small thickness, which enables heat transfer measurements to be made with little or no disturbance of flows in turbomachinery or in hypersonic flow facilities;
- its rapid response, which facilitates measurement of heat transfer in unsteady flows or with rapidly changing conditions, such as on the rotors and stators of rotating machinery or in moving parts of internal combustion engines;
- its small size, which permits finely detailed measurements of heat transfer, or measurements at specific points in machines or processes;
- its ability to be calibrated on the object whose heat transfer is to be measured, thus minimizing instrumentation errors potentially caused by application of a gage to a surface after the gage is calibrated elsewhere;
- its high temperature capability, which makes measurements possible in harsh environments such as combustion chambers and reactors;
- its high heat flux rate capacity, which makes measurements possible in highly energetic systems;
- its low thermal drop, which does not disturb heat flux distribution, making results more precise and accurate; and
- its large number of thermoelectric junctions, which yield good signal levels, improving accuracy and preventing interference from other instrumentation and the experimental environment.

CALIBRATION OF THE INVENTION

All heat flux gages must be calibrated to determine their gage constant, i.e. their voltage output and temperature drop as a function of heat flux. The gage of the invention is no exception, but its configuration and time response lend themselves especially well to calibration by dynamic methods.

VARIATIONS OF THE INVENTION

While the preferred embodiment described above is optimum for many applications of the heat flux gage, those skilled in the art will recognize that many minor modifications and variations are possible without departing from the spirit and scope of the invention. The number of thermocouple junctions, the thickness of insulating layers and conductors, and the exact manner of connection between the gage and its measurement system, are all subject to design choice based on requirements of the application. Thermocouple junctions may be arrayed in a single row or multiple rows or along an arc or arcs, and may be deposited in alternating positions, as depicted in the preferred embodiment, or directly on opposite sides of the planar thermal resistance element. The selection of metals for the thermopile, insulating materials for the base insulating layer, planar thermal resistance element and protective layer are all based on application requirements such as maximum temperature, heat flux rate and gage constant desired.

The invention may be modified by addition of one or more isolated thermocouples between the base insulating layer and the planar thermal resistance element, or between the thermal resistance element and the protective layer, in order to measure the temperature of the gage itself. Such a measurement may be useful; in characterizing the performance of the gage and in its calibration. Connections to these isolated thermocouples may be made in the manner already described for the gage itself, or by use of conventional thermocouple connection techniques.

In producing a heat flux gage according to the invention, other processes for masking and deposition of thin layers may be substituted for those described above. For example, instead of the lift-off process, an etching process may be employed. In etching, the entire surface is coated by sputtering, then a photoresist is used to produce a mask which permits selective etching away of the coating to produce the desired pattern. Other means of producing the pattern are sputter etching, ion beam etching, and plasma etching. Electrodes may also be deposited electrolytically, or by ion beam deposition, chemical vapor deposition, or by epitaxy from a molecular beam or a liquid phase. There is a wide range of possible methods, but the process of FIG. 3 and its description above is preferred because all the layer compositions required may be deposited using the same method and apparatus.

I claim:

1. A heat flux gage for measurement of heat transfer through a surface comprising:
   a first thin film of electrically insulating material deposited on said surface;
   a first thin film electrode of a first metal deposited on said first thin film of electrically insulating material;
   a second thin film electrode of a second metal deposited on said first thin film of electrically insulating material and partially overlapping said first thin film electrode to form a first thermoelectric junction;
   a thin film of thermally insulating material deposited over said first and said second thin film electrodes and said first thin film of electrically insulating material, having an aperture or interconnection area over a portion of said second thin film electrode;
   a third thin film electrode of said second metal deposited on said thin film of thermally insulating material and overlapping and electrically contacting said second thin film electrode through said interconnection area;
   a fourth thin film electrode of said first metal deposited on said thin film of thermally insulating material, overlapping said third thin film electrode to form a second thermoelectric junction;
   a second thin film of electrically insulating material deposited over said third and fourth thin film electrodes and said thin film of thermally insulating material; and
   means for connection of a voltage measuring instrument to said first and said fourth thin film electrodes.

2. The device of claim 1 in which said means for connection comprises insulated pins which penetrate said surface and electrically contact said first and said fourth thin film electrodes.

3. The device of claim 1 or 2 in which each of said first and said second metals is from the group which have melting points greater than 500 degrees centrigrade.

4. A heat flux gage for measurement of heat transfer through a surface comprising:
   a first thin film of electrically insulating material deposited on said surface;
   a plurality n of first thin film electrodes of a first metal deposited on said first thin film of electrically insulating material;
   a plurality n of second thin film electrodes of a second metal deposited on said first thin film of electrically insulating material, each of said second thin film electrodes partially overlapping one of said first thin film electrodes to form a plurality n of first thermoelectric junctions;
   a thin film of thermally insulating material deposited over said first and said second thin film electrodes and said first thin film of electrically insulating material, having an interconnection area over a portion of each of said first and said second thin film electrodes;
   a plurality n of third thin film electrodes of said second metal deposited on said thin film of thermally insulating material, each overlapping and electrically contacting one of said second thin film electrodes through said aperature over said second thin film electrode;
   a plurality n of fourth thin film electrodes of said first metal deposited on said thin film of thermally insulating material, each overlapping one of said third thin film electrodes to form a plurality n of second thermoelectric junctions, all but one of said plurality of fourth thin film electrodes also overlapping and electrically contacting an adjacent one of said first thin film electrodes through said interconnection area over said first thin film electrode to form a series thermopile having two end electrodes, one of said end electrodes being a first thin film electrode and the other of said end electrodes being a fourth thin film electrode;

a second thin film of electrically insulating material deposited over said third and fourth thin film electrodes and said thin film of thermally insulating material; and means for connection of a voltage measuring instrument to said end electrodes of said series thermopile.

5. The device of claim 4 in which said means for connection comprises insulated pins which penetrate said surface and electrically contact said end electrodes.

6. The device of claim 4 or 5 in which each of said first and said second metals is from the group which have melting points greater than 500 degrees Centigrade.

* * * * *